United States Patent [19]
Watkins

[11] Patent Number: 5,196,286
[45] Date of Patent: Mar. 23, 1993

[54] METHOD FOR PATTERNING A SUBSTRATE

[76] Inventor: Roger D. Watkins, 921 Lake Ave., P.O. Box 754, Quinnesec, Mich. 49876

[21] Appl. No.: 387,941

[22] Filed: Jul. 31, 1989

[51] Int. Cl.$^5$ .................... G03G 13/14; G03G 13/28; G03G 13/00
[52] U.S. Cl. ...................... 430/126; 430/31; 430/49; 430/902
[58] Field of Search ............. 430/31, 902, 49, 126

[56] References Cited

U.S. PATENT DOCUMENTS

| | | | |
|---|---|---|---|
| 2,919,179 | 12/1959 | Van Wagner | 430/126 |
| 4,359,516 | 11/1982 | Nacci et al. | 430/49 |
| 4,661,431 | 4/1987 | Bujesc et al. | 430/126 |
| 4,717,639 | 1/1988 | Dubin et al. | 430/124 |
| 4,859,557 | 8/1989 | Detig et al. | 430/126 X |
| 4,897,326 | 1/1990 | Marengo | 430/49 X |

OTHER PUBLICATIONS

Rochester Commerce, "Haloid Introduces Latest Xerox Development", May 1956, vol. 43, No. 5, p. 36.

Primary Examiner—Marion E. McCamish
Assistant Examiner—Stephen C. Crossan
Attorney, Agent, or Firm—Albert W. Watkins

[57] ABSTRACT

Disclosed is a method for patterning a substrate. A laminate of an electrically non-conductive material, an electrically conductive material, and an additional electrically non-conductive material is xerographically processed so as to leave a toner image formed upon the surface of one of the non-conductives. The non-conducive and conductive are successively removed chemically in those areas not coated by the toner, leaving a conductive pattern replica of the original toner image. Subsequent processing yields an exposed conductive pattern overlaying a non-conductive supporting substrate. Xerographic processes includes photocopying and xerographic laser imaging from a low power laser printer. The laminate may be formed in a single step or may be the product of a commercial two layer laminate coated by a standard painting or sealing process.

18 Claims, 2 Drawing Sheets

METHOD FOR PATTERNING A SUBSTRATE

FIELD OF THE INVENTION

The present invention pertains generally to a method of forming a pattern on a substrate, and particularly to forming a pattern of high quality, rapidly, for low cost, with ease of subsequent design modification.

BACKGROUND OF THE INVENTION

Printed wiring boards produced for the electronics industry have previously been manufactured by a variety of methods. The choice of the method is dependent upon anticipated production volumes, required delivery times, performance requirements, component density, conductor spacing, etc. Presently available methods include printing processes, engraving processes, and forming processes.

In the printing process, negative or positive ink images are printed upon a substrate using one of a variety of prior art printing techniques. The process may be an additive process where the substrate is originally electrically non-conductive. The ink which is printed may dry or cure into a conductive material, or may require additional processing such as firing at elevated temperatures and possibly in highly controlled environments to result in a suitable conductive pattern. If the process is a subtractive process, an essentially continuous conductive material is laminated to a substrate material. The conductive coating is patterned by a resist ink, where the resist ink resists a following removal process of the exposed (non-inked) conductive.

In the additive process with kiln firing, particulate inks are commonly used, usually composed of palladium-silver or one of the newer base metal materials (usually copper). This firing necessitates expensive kilns with controlled atmospere. The printing of the inks has been proven to be best accomplished with a screen printing technique, due in part to the particulate characteristics of the inks and in part to the requisite rheology of the ink necessitated by the printing and then firing sequence.

The screen printing and firing method has proven out in high volume high quality production, but clearly the cost of a screen printer and kiln would not be justified for low-volume or reduced cost application. Additionally, since the requisite firing process involves elevated temperatures, the choice of substrate materials which will survive the high temperatures is severely limited. With this process a screen must be fabricated prior to any printing process, the kiln must be pre-heated, and finally the substrate must be printed and fired for a particular time period. The turn-around time from wiring pattern to finished circuit is clearly extensive, and not justifiable for prototyping of wiring patterns.

A relatively recent process utilizing a polyethylene coated substrate dusted with copper powder, heated in a pattern by a moderately powered laser so as to melt the copper into the polyethylene in the pattern, blowing off the remaining loose copper, and firing the substrate to produce a pattern offers a solution to some of the drawbacks associated with a screen printing process in the way of prototyping and turn around time, but the initial capital investment is still very large.

Where the process is additive without firing, a conductive paint consisting of a filled polymeric material may be used. The paint typically will be a silver filled epoxy or a carbon filled polymer. With this method many different substrate materials may be utilized. However, the material used will not survive elevated temperatures and often will not be solderable. Electrical connections have been made by either mechanical pressure, painting the connection, or plating through an additional additive step to provide a solderable surface.

The extra expense and lengthened turn-around time caused by poor solderability as well as the potential for reduced quality is apparent and is the subject of extensive research. This method has found limited application in the prototyping of wiring boards, where a simple circuit without significant dimensional limitations may be hand painted upon a substrate. Devices may then be mounted with additional painting. Very little capital investment is required with this method. However, the turn-around time for this method is still very great, as the patterning process has been performed by hand or with the aid of a screen for screen printing. Once the pattern is formed, the wiring board must be allowed to dry and fully cure. This will typically be 24 hours in the case of a filled epoxy. The board is not readily repairable, and any alterations to the design, as is common in the case of prototyping, require repeating the turn around time. Additionally, the finished product may not accurately represent a production quality board, due to the process variations inherent in this prior art method.

Additive plating processes have been devised but have not gained significant a supplies and the environmental hazards associated therewith. In order to selectively plate, some type of printing process must occur prior to the plating, and the plating process itself has not yet been competitive with other available processes.

In the subtractive processing of wiring boards, several mechanical and chemical variations exist. With this method the patterning of some type of resist over the conductive material is followed by a chemical etch of exposed conductive and then removal of the resist. The resist may be applied by lithographic, photolithographic, screen, or other known printing process. Alternatively, adhesive backed appliques may be applied to form the resist, or commercially available drawing pencils may be used.

The prior art subtractive processing techniques are faced with reliability and labor intensity problems in the case of the pen or applique methods, and expense and turn-around problems in the case of the known printing methods available for resist patterning.

Engraving processes are automatically accomplished with either a high power laser or a numerically controlled router. These methods, while highly effective, require an enormous capital investment and are not readily suited for high volume production. In summary, they have found application in those shops where computer aided design and prototyping is both frequent and necessary for the work. Hand engraving is also possible, though rarely used due to the time required to form a wiring pattern.

Forming processes include the process of wire wrapping. This method probably has been used for the greatest time period and continues to be in use today. It requires little initial investment, can be applied to volume production with the automated machinery available (although with correspondingly larger cost), and is suited for rapid modification in the case of prototyping. However, as the demand for higher density circuitry with greater speeds is felt throughout the electronics industry, wire wrapping is most unable to answer these particular demands.

The primary objective of the present invention is to overcome the disadvantages of the prior art while adding or retaining the desirable features of low initial investment, high quality production, rapid production, and ease of design modification.

SUMMARY OF THE PRESENT INVENTION

The preferred embodiment of the present invention is a method of forming a pattern on a substrate having a first conductive surface and being otherwise non-conductive wherein the first conductive surface is coated with a second thin non-conductive wherein the first conductive surface is coated with a second thin non-conductive layer, the second non-conductive layer subsequently selectively patterned through a xerographic technique and selectively etched so as to re-expose the first conductive surface in those areas not selectively patterned, the first surface being subsequently etched to remove those re-exposed areas and finally cleaned to remove all residual non-conductive layer and patterning material, thereby leaving a conductive pattern on the otherwise non-conductive substrate.

In alternative embodiments, the selective patterning is accomplished through the use of a photocopying technique or a laser printing technique.

These and other features of the invention will be more readily understood upon consideration of the detailed description hereinbelow.

DETAILED DESCRIPTION OF THE PREFERRED EMBODIMENT

Figure 1:
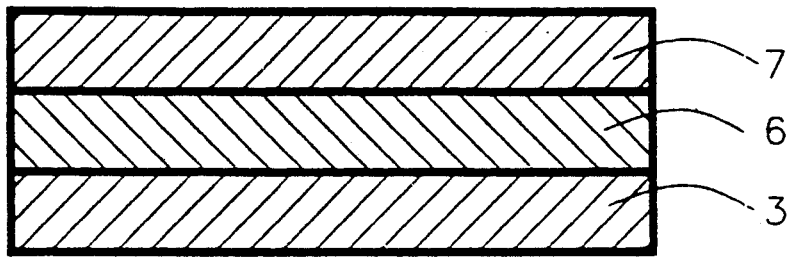
FIG. 1 shows a cross-sectional view of a prepared substrate prior to any patterning in accord with the preferred embodiment of the present invention.

Referring now to FIG. 1, a prepared substrate is illustrated as comprising three layers. The first layer 3 is the substrate of the wiring board and may consist of any advantageous non-conductive material, such as glass epoxy. Layer 6 is the conductive and may be composed typically of copper, although any other suitable conductive material may be used. The present laminate of copper and glass epoxy is widely commercially available and is used as the starting stock material for most subtractive or engraving processes. Many thicknesses are available depending upon the requirements of the xerographic engine and the application.

Figure 4:
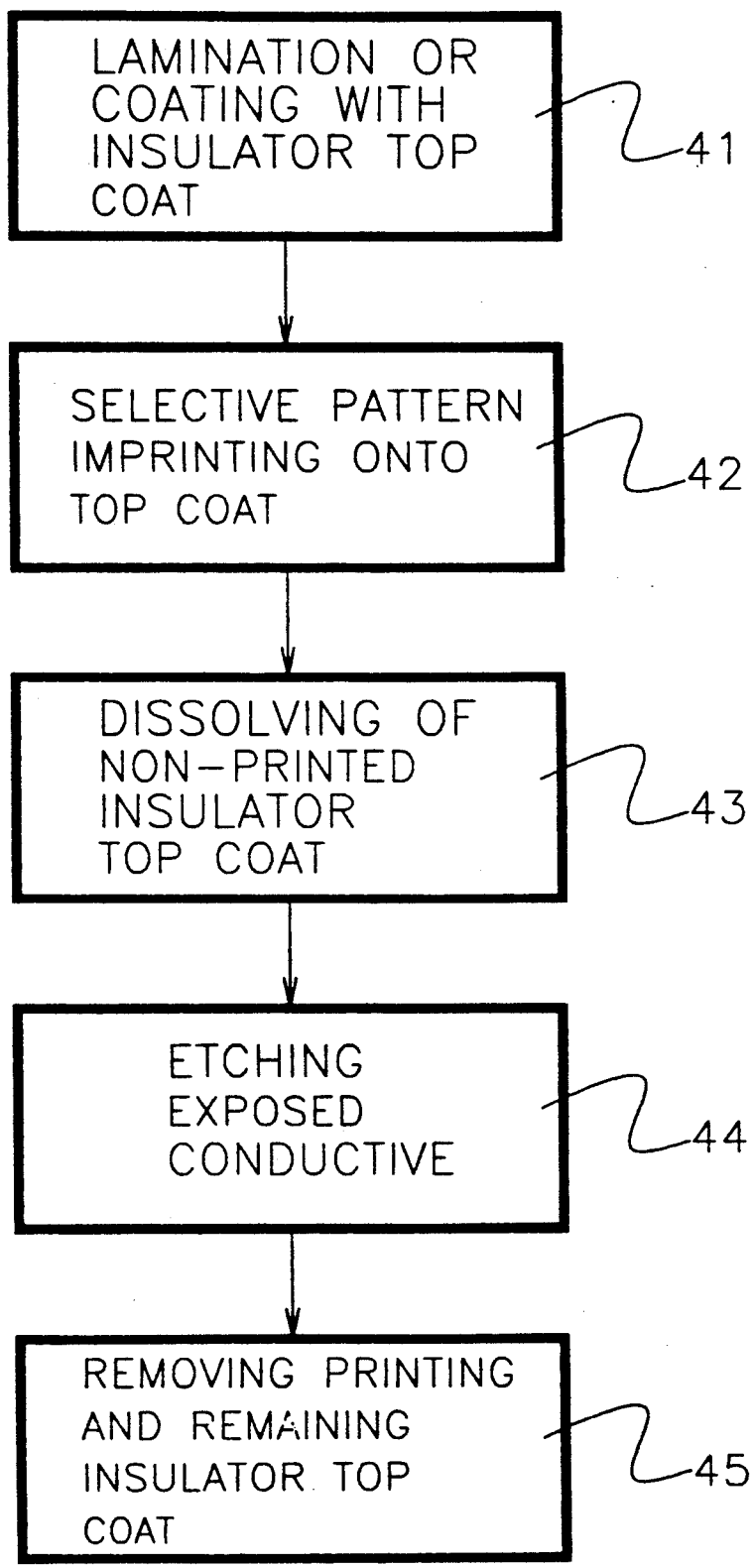
FIG. 4 shows a flow chart diagrammatic of the method of the preferred embodiment.

In the preferred embodiment an additional non-conductive layer 7 is added. Layer 7 consists of a selectively removable non-conductive material. This is illustrated in the flow chart of FIG. 4 as step 41, and may take place either in the lamination process or as a coating applied to an already available commercial laminate. Once the top coat is in place, the material is imprinted. This may be accomplished by feeding the stock material illustrated in FIG. 1 through a typical photocopying machine or laser printer. With proper selection of insulator 7, the toner used in the copy machine or laser printer will adhere to insulator 7. An acrylic such as B-82 available from Rohm and Haas, Philadelphia, Pa. is suitable for use with a Hewlett Packard LaserJet printer. The acrylic layer 7 serves to prevent the shorting and resultant bleeding off of electric charge which would otherwise result from the contact between the copier and the conductive layer 6. In this way, a good toner image is produced upon the material. Layer 7 additionally works synergistically with the toner in the next developing step 43.

The pattern to be imprinted may come from artwork produced on paper by known layout or graphic design, or in the case of the laserprinter a computer program. Prototyping is thus enhanced, since a design alteration would merely require feeding another stock laminate 1 through the laser printer or photocopier, followed of course by the balance of processing.

With a desired pattern imprinted upon layer 7, the entire board is immersed into a selective solvent chosen for the selective dissolution of the insulator 7 with little dissolution of the toner. In the case of the acryloid and toner mentioned above, such a solvent would be ethanol. The result of this processing step is the exposure of conductive layer 6 in those places not imprinted by toner.

Figure 2:
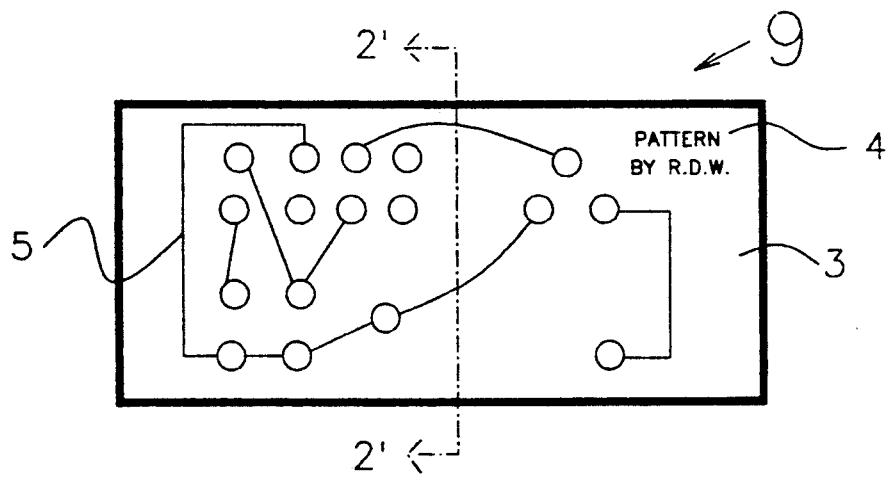
FIG. 2 shows a top view of a patterned substrate midway through production in accord with the preferred embodiment of the present invention.
Figure 3:
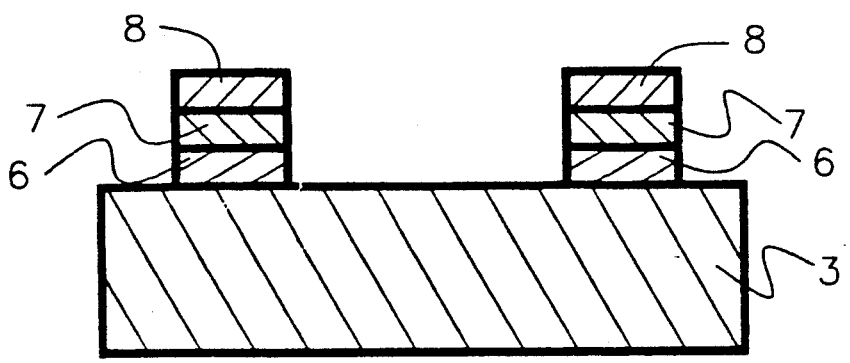
FIG. 3 shows a cross-sectional view of the substrate of FIG. 1.

The board is then immersed in an etchant as illustrated by step 44. For a copper board a standard ferric chloride solution would be a satisfactory etchant. Note that the etchant chosen must dissolve the conductive material selectively without simultaneous dissolution of imprinted insulator 7 and toner 8. At this point, the board is illustrated by top view in FIG. 2 and by cross-section in FIG. 3. From FIG. 2 it is apparent that the pattern is fully visible upon the substrate 3. Both text and graphics 4 and wiring patterns 5 are possible, depending upon the application and requirements of the user. By cross-section the still contiguous substrate 3 has an overlaying pattern of copper conductive 6, insulator 7, and toner 8.

A standard printed wiring board requires the conductive layer 6 be exposed, so in step 45 the toner 8 and insulator 7 are removed leaving a finished board. The solvent for step 45 may be a relatively volatile solvent, but with the materials thus far described either a light lubricating oil or an alkaline bath or even an abrasive scrubbing is sufficient to accomplish removal of the insulators without adversely affecting the conductive 6 or the substrate 3. Where requirements allow for a thermally decomposable coating no final removal step may be required. The insulator 7 will provide environmental corrosion protection for the conductive and will burn completely leaving no residue where soldered or otherwise thermally processed at sufficiently elevated temperatures.

Using the above described method a high quality printed wiring board may be produced. The board may be produced in relatively large volume with negligible time required for design change, and is ideally suited for integration into a computer aided design and manufacturing operation. The capital cost for requisite equipment is low and already in possesion of many electronics or graphic design establishments. The method offers wide variety in terms of compatible materials, the controlling factors being the type of toner and the processing method used by a given photocopier or laser printer. The present application of the HP LaserJet and Rohm and Haas Acryloid is preferred since the most toxic processing steps are the etching with ferric chloride, which is an industry standard etchant, and dissolution of the insulator 7 in ethanol. Ethanol, or grain alcohol is presently consumed in alcoholic beverages. The process may be fully applicable to certain graphic design projects where selective etching is desired.

While the foregoing describes what the applicant believes to be the preferred embodiment of the invention, it is in no way intended to be limiting to the scope or potential breadth of the invention. The invention is described and limited only by the claims appended hereinbelow.

Having thus described my invention, I claim:

1. A method for patterning a blank comprising the steps of:
   Xerographically forming a pattern on a first electrically non-conductive surface of said blank; and
   selectively removing a first portion of said first non-conductive and a first portion of an electrical conductor to leave said pattern and a second portion of said non-conductive and a second portion of said conductor, said second portions having form substantially similar to said pattern.

2. The method of patterning of claim 1 comprising the additional step of:
   totally removing said first non-conductive and said pattern while leaving said second portion of said conductor substantially unaltered.

3. The method of patterning of claim 2 wherein said xerographic process is comprised by a laser printing transfer process.

4. The method of claim 2 comprising the further step of
   further removing said pattern and said second portion of said non-conductive from said second portion of said conductor while leaving said second portion of said conductor substantially unaltered.

5. The method of patterning of claim 2 wherein said xerographic process is comprised by a photocopier process.

6. The method of patterning of claim 1 wherein said step of selective removing leaves a substantially electrically non-conductive substrate layer substantially unaltered.

7. The method of patterning of claim 6 wherein said step of selectively removing is comprised by the steps of:
   loosening said first non-conductive from contact with said conductor in those areas where said non-conductive is not sandwiched between said pattern and said conductor; and
   etching said conductor to remove said conductor from contact with said second non-conductive in those areas where said conductor is not sandwiched between said first and said second non-conductives.

8. The method of patterning of claim 7 wherein said loosening comprises the softening of said first non-conductive in a solvent.

9. The method of patterning of claim 8 wherein said solvent is comprised by a relatively non-hazardous material.

10. The method of patterning of claim 9 wherein said solvent is comprised by an alcohol.

11. The method of patterning of claim 7 wherein said etching is performed chemically.

12. A method of forming a blank comprising the steps:
    selecting a xerographic process and an image transfer medium compatible with said xerographic process;
    choosing a first material for forming a first electrically non-conductive surface, said first material being compatible with said image transfer medium and said xerographic process to be patternable responsive to said xerographic process; and
    forming a blank having a first surface comprised by said first material, an electrically conductive layer, and a second electrically non-conductive surface, said conductive layer substantially sandwiched between said non-conductive surfaces.

13. The method of forming of claim 12 wherein said choosing step comprises the additional steps of:
    identifying one or more materials which are electrically non-conductive; and
    adopting a one of said one or more materials for use as said first material, which said one is removable by a process which substantially does not affect said image transfer medium or said conductive layer.

14. The method of forming of claim 12 wherein said first material will substantially retain a xerogrphaic image during etching of said conductive layer.

15. A method of forming a printed wiring board comprising the steps of:
    forming a laminate of a physical support, an electrical conductor, and an electrical insulator;
    patterning said laminate through a xerographic process to produce a discontinuous barrier;
    removing said insulator from said conductor where said insulator is not covered by said barrier and removing said conductor from said support where said conductor is not covered by said barrier and said insulator.

16. The method of claim 15 comprising the additional step of cleaning said wiring board to remove any of said barrier or said insulator still remaining in contact with said board.

17. The method of claim 16 wherein said cleaning step comprises chemically dissolving said barrier and said insulator while not significantly altering said support and said conductor.

18. The method of claim 16 wherein said cleaning step comprises physical removal by a mechanical means while not significantly altering said support and said conductor.

* * * * *